(12) United States Patent
Matsubara et al.

(10) Patent No.: US 6,977,951 B2
(45) Date of Patent: Dec. 20, 2005

(54) SEMICONDUCTOR LASER APPARATUS AND OPTICAL PICKUP APPARATUS USING SAME

(75) Inventors: Kazunori Matsubara, Nara-ken (JP); Ayumi Yagi, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 189 days.

(21) Appl. No.: 10/384,543

(22) Filed: Mar. 11, 2003

(65) Prior Publication Data
US 2003/0174748 A1 Sep. 18, 2003

(30) Foreign Application Priority Data
Mar. 12, 2002 (JP) .............................. 2002-066601

(51) Int. Cl.⁷ ................................................ H01S 5/00
(52) U.S. Cl. .................................................. 372/43.01
(58) Field of Search ........................ 372/36, 43, 43.01

(56) References Cited

U.S. PATENT DOCUMENTS 5,727,009 A * 3/1998 Tajiri et al. .................... 372/43
2003/0147436 A1 * 8/2003 Yagi et al. .................... 372/36

FOREIGN PATENT DOCUMENTS

| JP | 06-005990 | 1/1994 |
| JP | 06-203403 | 7/1994 |
| JP | 11-025465 | 1/1999 |
| JP | 2000-196176 | 7/2000 |
| JP | 2000-196177 | 7/2000 |
| JP | 2001-111159 | 4/2001 |

OTHER PUBLICATIONS

English Translation of JP 06-203403 (original published Jul. 22, 1994).*

* cited by examiner

*Primary Examiner*—Minsun Oh Harvey
*Assistant Examiner*—James Menefee
(74) *Attorney, Agent, or Firm*—Morrison & Foerster LLP

(57) ABSTRACT

A semiconductor laser apparatus of the present invention is composed of an insulating frame 11 in which at least a semiconductor laser device and a light receiving device are mounted. A plurality of leads 10 pass through each of two opposite faces 63A, 63B of the insulating frame 11 and extend from inside to outside of the insulating frame. The insulating frame 11 has external faces 61A, 61B that are parallel to a mounting face 30*a* on which the semiconductor laser device 1 is mounted. According to the present invention, it is possible to provide a semiconductor laser apparatus that has good productivity and that facilitates position adjustment such as optical axis adjustment and an optical pickup apparatus using the same.

1 Claim, 7 Drawing Sheets

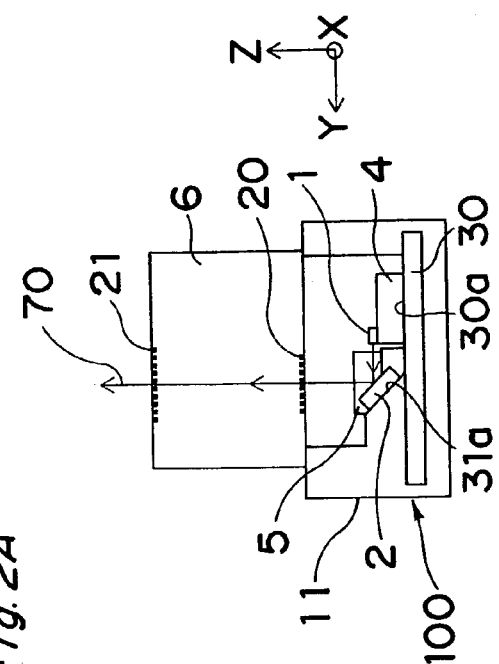
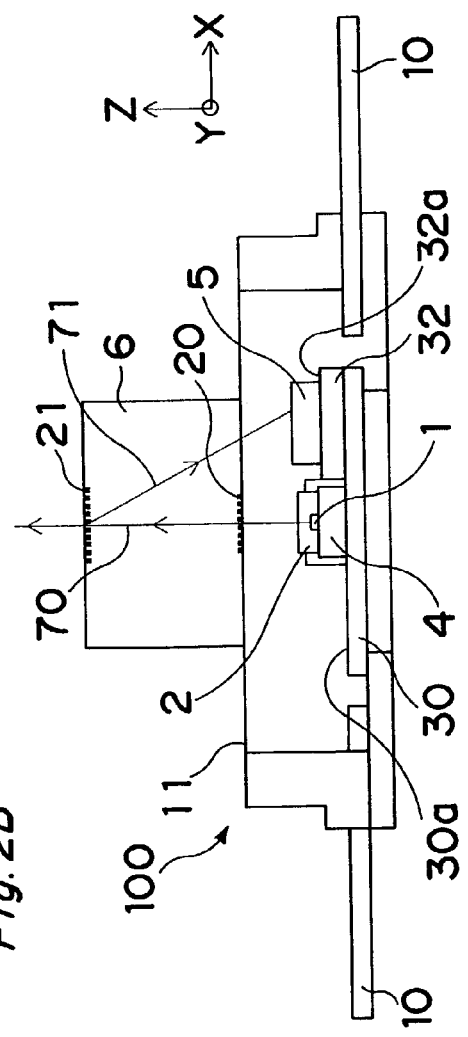

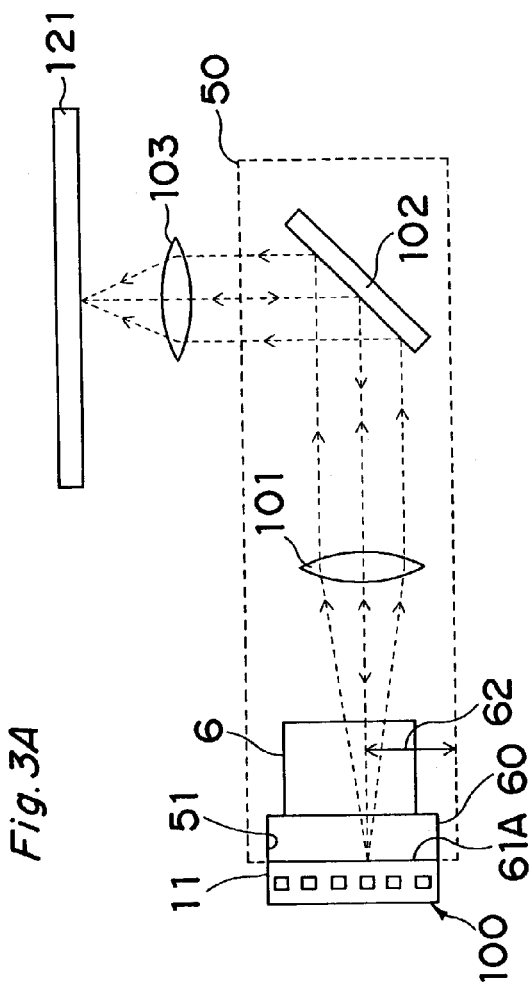
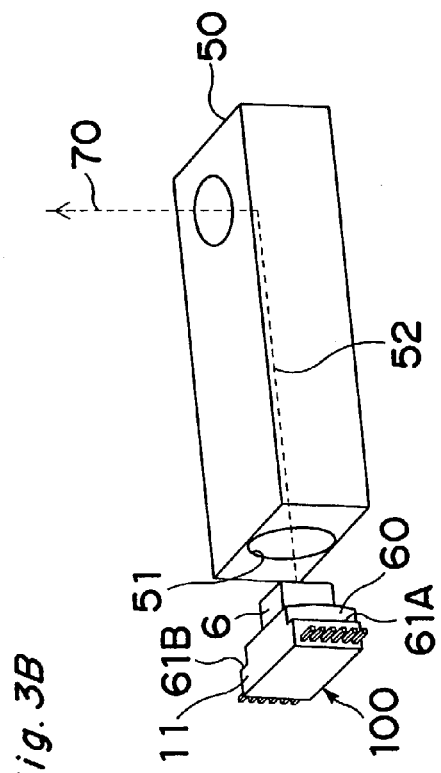
Fig. 3A
Fig. 3B

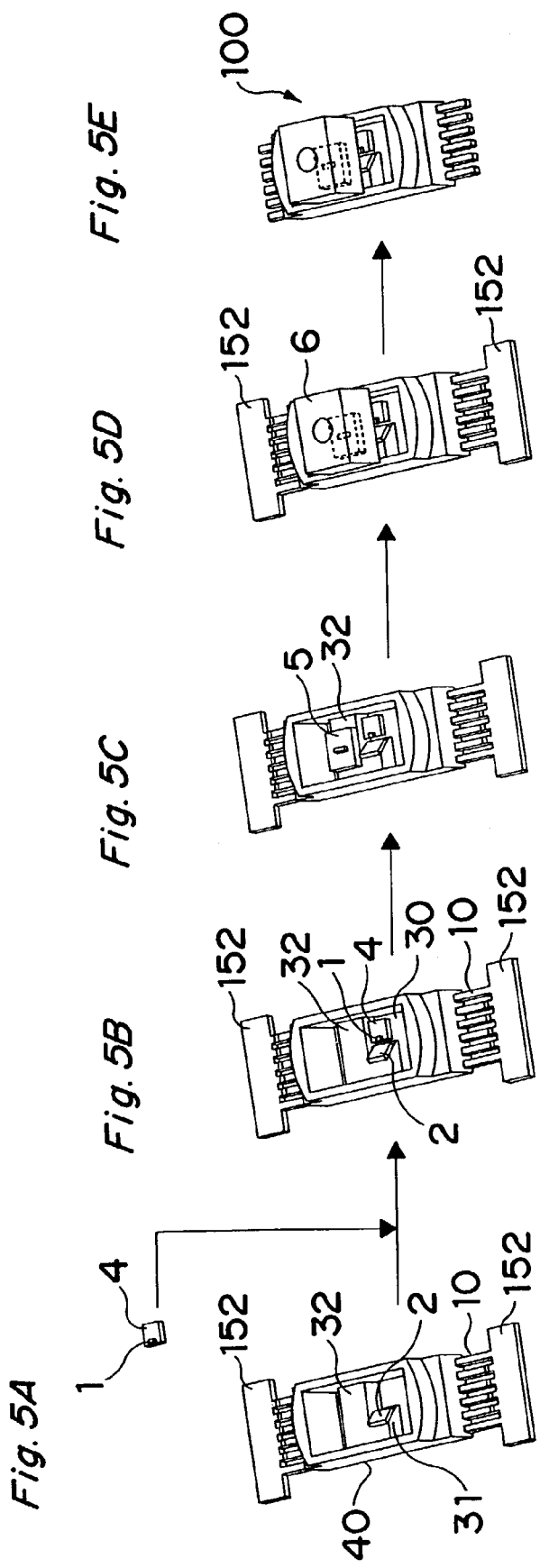

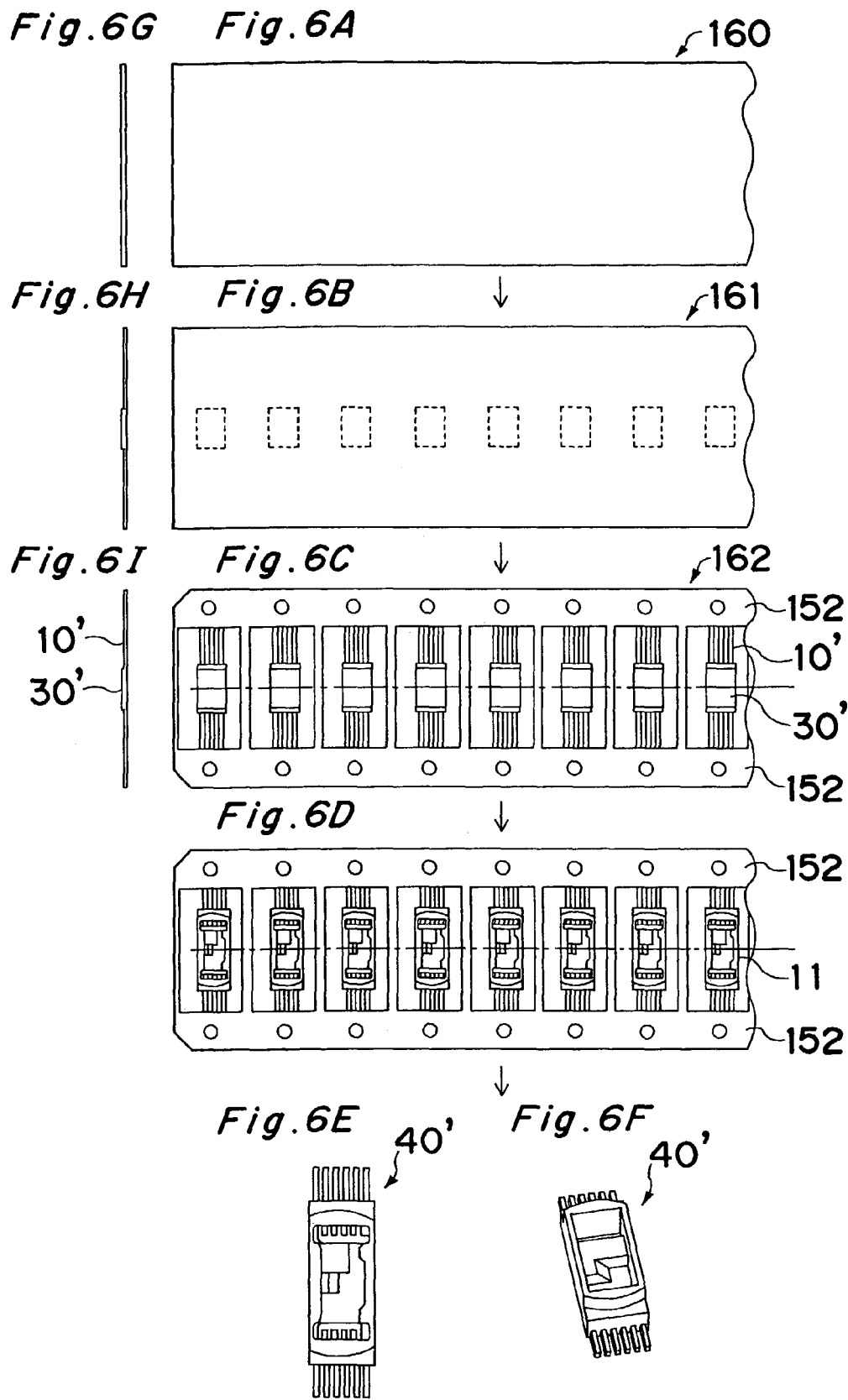

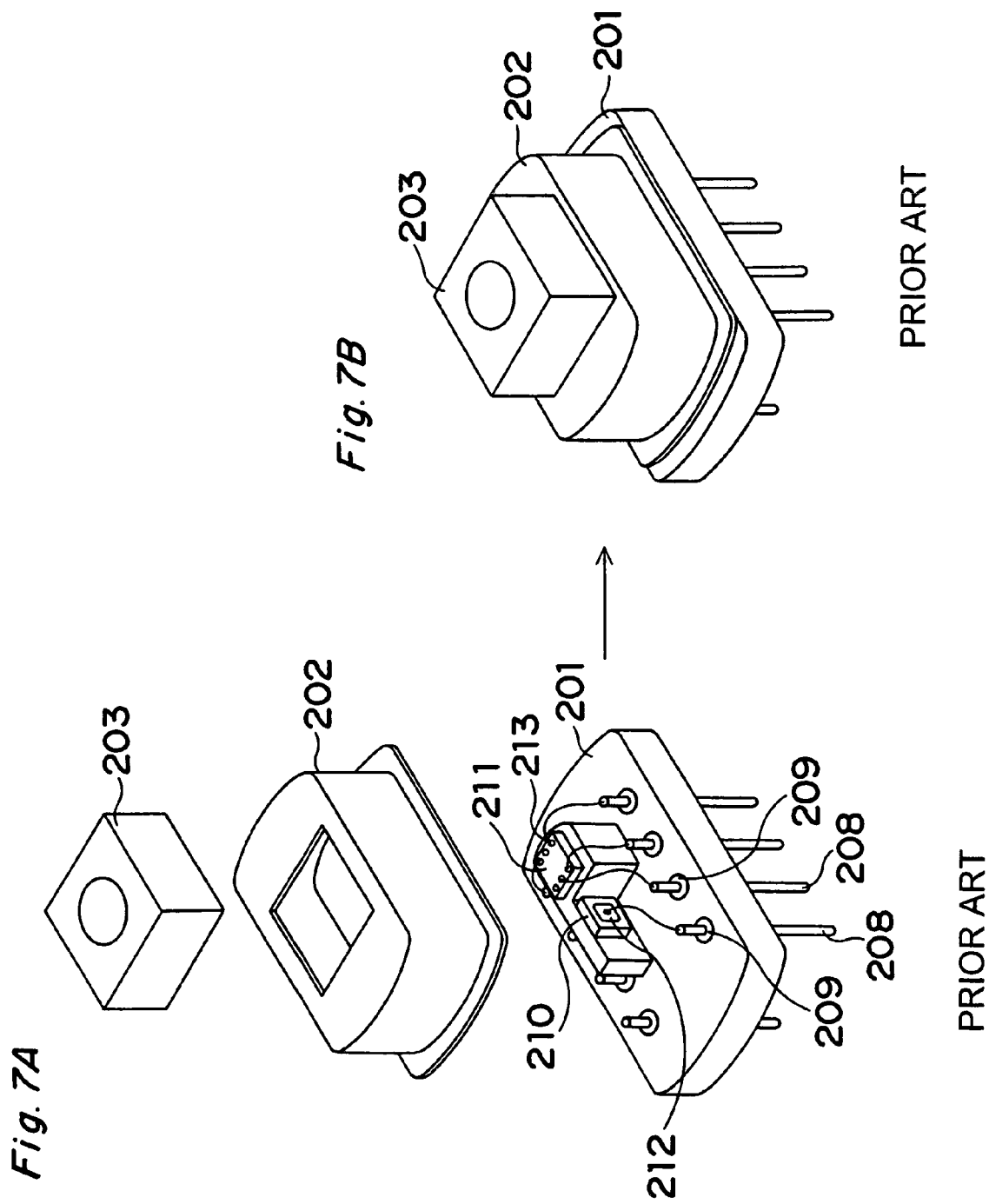

SEMICONDUCTOR LASER APPARATUS AND OPTICAL PICKUP APPARATUS USING SAME

BACKGROUND OF THE INVENTION

The present invention relates to a semiconductor laser apparatus usable in apparatuses such as optical pickup apparatuses that read data recorded on an optical recording medium, and to an optical pickup apparatus using the same.

An optical pickup apparatus used in optical memory apparatuses such as CD-ROM and MD (Mini-Disk) for reading a signal of optical disks uses a semiconductor laser apparatus with a semiconductor laser device, a signal detection light receiving device, a hologram device and the like stored in one package. In such a semiconductor laser apparatus, a light beam is emitted from the semiconductor laser device, and then the light beam reflected and returned by an optical disk is diffracted by the hologram device and led to the signal detection light receiving device disposed in a position away from an optical axis of the semiconductor laser device. Such a method is called a hologram laser method.

Examples of a conventional semiconductor laser apparatus using the hologram laser method include one disclosed in Japanese Patent Laid-Open Publication HEI No. 6-5990. The outlined structure thereof is shown in FIGS. 7A and 7B. It is noted that FIG. 7A is an exploded perspective view and FIG. 7B is a perspective outview.

In this structure, a semiconductor laser device (LD) 210 and a signal detection light receiving device 211 are mounted on a stem 201, and a cap 202 is placed so as to cover the LD 210, the signal detection light receiving device 211 and the like, and further on top of the cap 202, a hologram device 203 is mounted. Power supply to internal devices (including the LD 210 and the signal detection light receiving device 211) and signal extraction to the outside are carried out via a lead 208. The package has a circular shape whose upper and lower circular arcs are removed. This shape fulfils a thinner package.

However, the above prior art has following problems.

First, the above-structured package needs the step of forming holes for the leads 208 to go through the stem 201, inserting the leads to the holes one by one, and sealing the holes with an insulating material 209, which brings about such disadvantage as a complicated manufacturing method and a higher cost.

Also, as shown in FIG. 7A, the LD 210 and the signal detection light receiving device 211 are disposed at an angle of 90 degrees from each other, so that mounting of the LD 210 on the stem 201 is different from mounting the light receiving device 211 in that the whole package is required to be inclined 90 degrees for mounting the LD 210. Consequently, in the step of mounting each device, there have been a problem in terms of processing efficiency as well as a problem of an apparatus becoming complicated.

Further, an electrode 212 of the LD 210 shown in FIG. 7A is disposed in the state of being inclined 90 degrees from an electrode 213 of the signal detection light receiving device 211. For wire-boding the LD 210 and the lead 208, therefore, the whole package needs to be rotated 90 degrees first. Consequently, in the step of wire-bonding each device for establishing connection of each other, there have been a problem that work efficiency of wire-bonding is degraded, as well as a problem in terms of reliability and processing efficiency.

As described above, the prior art structure needs the step of forming holes for the leads to go through the stem, inserting the leads to the holes one by one, and sealing the holes with an insulating material, which brings about such disadvantage as a complicated manufacturing method and a higher cost. Further, the wire-bonding step for mounting each device on the package and establishing connection needs a preparatory step of rotating the whole package 90 degrees, which degrades work efficiency and reliability and causes a problem in terms of processing efficiency.

Further, in structuring an optical pickup apparatus with use of the prior art semiconductor laser apparatus, position adjustment such as optical axis adjustment is complicated by these problems.

SUMMARY OF THE INVENTION

For solving the above problems, it is an object of the present invention to provide a semiconductor laser apparatus that has good productivity and that facilitates position adjustment such as optical axis adjustment and an optical pickup apparatus using the same.

In order to accomplish the above object, a semiconductor laser apparatus of the present invention comprises:

an insulating frame in which at least a semiconductor laser device and a light receiving device are mounted; and a plurality of leads passing through each of two opposite faces of the insulating frame and extending from inside to outside of the insulating frame, wherein the insulating frame has external faces that are parallel to a mounting face on which the semiconductor laser device is mounted.

According to the present invention, there are provided an insulating frame in which at least a semiconductor laser device and a light receiving device are mounted, and a plurality of leads passing through each of two opposite faces of the insulating frame and extending from inside to outside of the insulating frame, which enables molding with use of, for example, a resin material and thereby achieves easy structuring of an insulating frame equipped with leads.

Also, since the insulating frame has external faces that are parallel to a mounting face on which the semiconductor laser device is mounted, the external faces may be used as reference planes for facilitating optical axis adjustment.

Further, in one embodiment of the semiconductor laser apparatus, the insulating frame has a protruding portion protruding vertically against the mounting face for continuously surrounding at least the semiconductor laser device mounted on the mounting face.

According to this one embodiment, since the insulating frame has a protruding portion protruding vertically against the mounting face for continuously surrounding at least the semiconductor laser device mounted on the mounting face, an optical device such as hologram devices may be disposed in the portions of the protruding portion, a gap between which is smaller than a gap between the lead disposing faces. This implements downsizing of the optical device and achieves downsizing of the entire apparatus.

Further, in one embodiment of the semiconductor laser apparatus, two opposite faces of the protruding portion are respectively cylindrical faces, and the two opposite faces through which the leads pass and the cylindrical faces are disposed in the same direction.

According to the one embodiment, two opposite faces of the protruding portion are respectively cylindrical faces, and the two opposite faces through which the leads pass and the cylindrical faces are disposed in the same direction, resulting in achieving downsizing of the apparatus. Also, in structuring an optical pickup apparatus, position adjustment of a frame may be facilitated. Also in the case that an outer periphery of the protruding portion has a shape composed of two facing circular arcs and two facing chords, over two chord portions of the protruding portion, a gap between which is smaller than the gap between two circular-arc portions of the protruding portion, an optical device such as hologram devices may be disposed. This implements downsizing of the optical device and thereby achieves downsizing of the entire apparatus.

Also, in one embodiment of the semiconductor laser apparatus, the insulating frame has a reflector disposing face for disposing thereto a reflector that changes direction of a light beam from the semiconductor laser device.

According to this one embodiment, the insulating frame has a reflector disposing face for disposing thereto a reflector that changes direction of a light beam from the semiconductor laser device. Accordingly, even if the semiconductor laser device is disposed so as to emit a light beam in a direction parallel to the mounting face, light emitting direction may be easily changed by disposing a reflector on the reflector disposing face of the insulating frame.

Also, in one embodiment of the semiconductor laser apparatus, the insulating frame has a light receiving device disposing face for disposing thereto the light receiving device.

According to this one embodiment, the insulating frame has a light receiving device disposing face for disposing thereto the light receiving device, which facilitates positioning of the light receiving device.

Also, in one embodiment of the semiconductor laser apparatus, any one of the leads is coupled to a mounting portion for mounting thereto the semiconductor laser device and a thickness of the mounting portion is larger than a thickness of the lead that is positioned outside of the insulating frame.

According to this one embodiment, any one of the leads is coupled to a mounting portion for mounting thereto the semiconductor laser device and a thickness of the mounting portion is larger than the thickness of the lead that is positioned outside of the insulating frame. This makes it possible to improve heat discharge characteristics.

Also, a pickup apparatus of the present invention using the semiconductor laser apparatus as defined above comprises a casing disposed so as to be in contact with the external faces that are parallel to the mounting face on which the semiconductor laser device is mounted.

According to the present invention, a casing of the optical pickup apparatus is disposed so as to be in contact with the external faces that are parallel to the mounting face on which the semiconductor laser device is mounted. This facilitates position adjustment of the casing with use of the external face as a reference plane.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A to 1D are views showing outlined structure of a semiconductor laser apparatus in the embodiment of the present invention, in which FIG. 1A is a plane view, FIG. 1B is a side view, FIG. 1C is a perspective view, and FIG. 1D is a perspective view with a device not mounted;

FIG. 2A is a cross sectional side view taken in the cutting line X—X of FIG. 1A, while FIG. 2B is a cross sectional side view taken in the cutting line Y—Y of FIG. 1A;

FIGS. 3A to 3B are views showing outlined structure of an optical pickup apparatus in the present embodiment, in which FIG. 3A is a side view and FIG. 3B is a perspective view each showing a substantial portion;

FIGS. 4A to 4E are plane views each showing the process in a method for manufacturing a package of the embodiment, in which

FIGS. 5A to 5E are perspective views each showing the process of mounting a device on a package and the like;

FIGS. 6A to 6E are plane views each showing the process in a method for manufacturing a package, in which FIG. 6F is a perspective view of FIG. 6E, and FIGS. 6G, 6H, 6I are side views of FIGS. 6A, 6B, 6C, respectively; and FIGS. 7A to 7B are views showing outlined structure of a conventional semiconductor laser apparatus, in which FIG. 7A is an exploded perspective view and FIG. 7B is a perspective outview.

DETAILED DESCRIPTION OF THE PREFERRED EMBODIMENTS

Hereinbelow, one embodiment of the present invention will be described with reference to drawings.

Figure 1A:
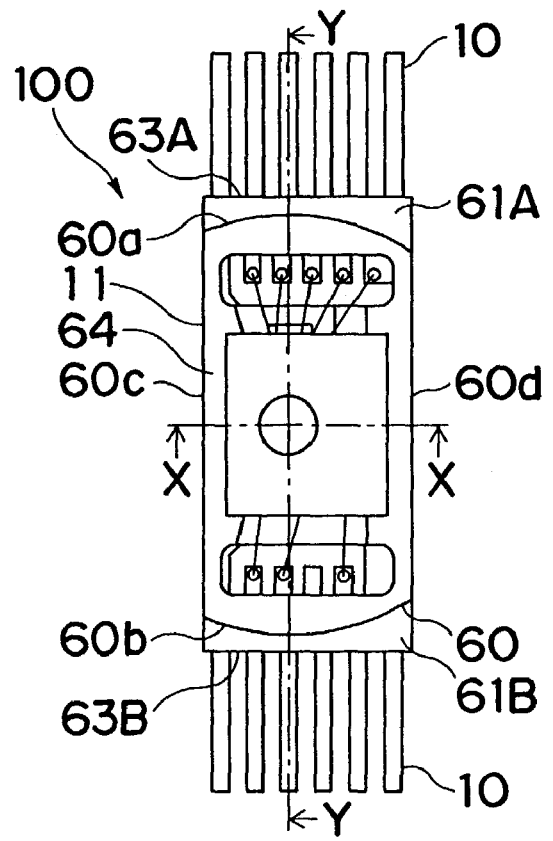
Figure 1B:
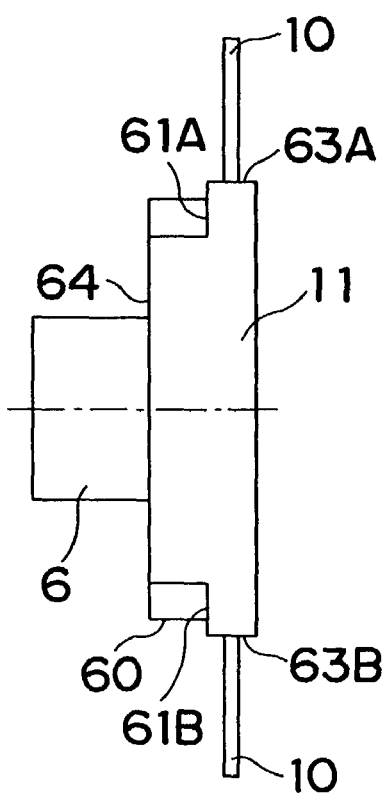
Figure 1C:
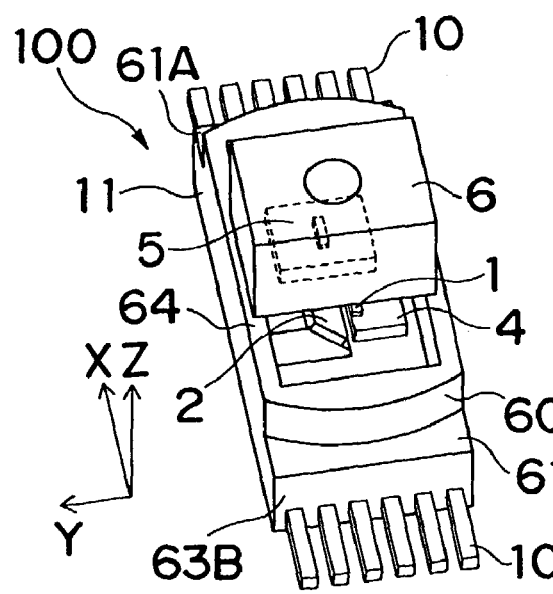
Figure 1D:
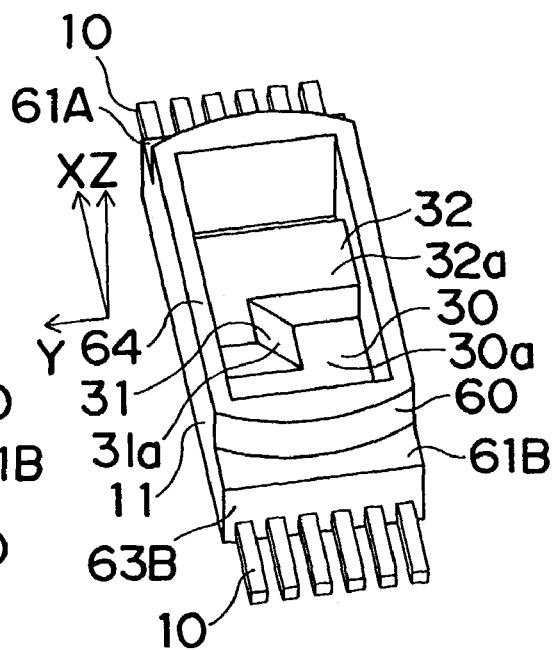

FIGS. 1A to 1D and FIGS. 2A to 2B show outlined structure of a semiconductor laser apparatus in the embodiment of the present invention. It is noted that FIG. 1A is a plane view, FIG. 1B is a side view, FIG. 1C is a perspective view, and FIG. 1D is a perspective view with a device not mounted. Also, FIG. 2A is a cross sectional side view taken in the cutting line X—X of FIG. 1A, while FIG. 2B is a cross sectional side view taken in the cutting line Y—Y of FIG. 1A.

Further, FIGS. 3A to 3B show outlined structure of an optical pickup apparatus with use of a semiconductor laser apparatus 100 of the present embodiment. It is noted that FIG. 3A is a side view and FIG. 3B is a perspective view each showing a substantial portion.

In FIGS. 1A to 1D and FIGS. 2A to 2B, there are shown a semiconductor laser device (LD) 1, a reflector (reflection mirror) 2, a lead (lead frame) 10, an insulating frame 11 formed by resin-molding a part of the lead frame, a monitor light receiving device (monitor photodiode) 4, a signal detection light receiving device (signal reading photodiode) 5, and an optical device (hologram device) 6. It is noted that the hologram device 6 has a three-beam generating grating pattern 20 and a beam splitting hologram pattern 21.

In FIGS. 3A to 3B, there are shown a semiconductor laser apparatus 100 of the present embodiment, a collimate lens 101, a reflection mirror 102, a condenser lens 103, and an optical recording medium (optical disk) 121. There are also shown an optical pickup apparatus casing 50 for mounting therein the collimate lens 101, the reflection mirror 102 and the like, a circular through hole 51 for mounting therethrough the semiconductor laser apparatus 100, and an optical axis 52. Here, the collimate lens 101 and the reflection mirror 102 are disposed in the casing 50 so as to align the center of the circular through hole 51 of the casing 50 with the optical axis 52 with good accuracy.

As shown in these drawings, the semiconductor laser device 1 and the signal detection light receiving device 5 are mounted in the insulating frame 11. On the two opposite faces 63A, 63B of the insulating frame 11, a plurality of leads 10 are each disposed from inside to outside in the state of passing through the insulating frame 11. The insulating frame 11 is composed of external faces 61A, 61B that are parallel to a mounting face 30a of an LD mounting portion 30 on which the semiconductor laser device 1 is mounted. It is noted that the mounting face 30a of the LD mounting portion 30 is formed on an island portion of the lead frame 10. Also, the external faces 61A, 61B serving as reference planes are adjusted such that a distance to a light emitting point of the semiconductor laser device 1 in Z-axis direction is set to be a specified distance.

Also, the insulating frame 11 is composed of a protruding portion 60 protruding vertically against the LD mounting face 30a for continuously surrounding the LD mounting face 30a. The optical device 6 is disposed in the state of sitting over an upper portion 64 of lateral portions 60c and 60d of the protruding portion 60, a gap between which is smaller than the gap between the lead disposing faces 63A and 63B. Consequently, the protruding portion 60 is given a closed-like shape.

Further, an outer periphery of the protruding portion 60 has the shape of a circle with two facing arches thereof removed from the circle and therefore surrounded with two facing circular arcs 60a, 60b and two facing chords 60c, 60d. On the side of the two circular-arc portions 60a, 60b, the two faces 63A, 63B on which the leads 10 are disposed in the state of passing through the two faces, and the external faces 61A, 61B serving as reference planes are disposed. Herein, an optical device 6 is disposed in the state of sitting over an upper portion 64 of two facing chords 60c, 60d of the protruding portion 60, a gap between which is smaller than the gap between two facing circular arcs 60a, 60b. It is noted that the center of the circular-arc portions 60a, 60b is set to be aligned with an optical axis 70 of the semiconductor laser device 1. Also, as shown in FIG. 1A, the circular-arc portions 60a, 60b of the protruding portion 60 has a shape asymmetric against Y-axis direction, and therefore distances from the center of the circular-arc portions 60a, 60b to the both lateral portions 60c and 60d differ.

Further, a reflector mounting portion 31 having a reflector mounting face 31a for mounting thereto a reflector 2 that changes direction of a light beam from the semiconductor laser device 1 and a light receiving device mounting portion 32 having a light receiving device mounting face 32a for mounting thereto a signal detection light receiving device 5 are formed integrally with the insulating frame 11 by resin molding. It is noted that the reflector mounting face 31a of the reflector mounting portion 31 has an angle of 45 degrees against the LD mounting face 30a of the LD mounting portion 30, and the reflector mounting portion 31 and the light receiving device mounting portion 32 are molded integrally with the insulating frame 11 with use of a resin material. In the present embodiment, a planar reflector 2 is mounted on the reflector mounting portion 31. Instead, a reflection coating may be directly formed on the reflector mounting face 31a by deposition or the like.

Next, referring to FIGS. 1A to 1D and FIGS. 2A to 2B, more detailed description will be given of the semiconductor laser apparatus of the present embodiment.

A semiconductor laser device 1 is fixed to the upper portion of a light receiving device for monitor 4 with use of a bond member. The light receiving device for monitor 4 is fixed onto an LD mounting face 30a in an island portion of a lead frame member 10 with use of a bond member. A reflection mirror 2 is molded integrally with an insulating frame 11 made of resin and is bonded, with a bond member, onto a reflector mounting face 31a that is inclined 45 degrees against the LD mounting face 30a in the island portion of the lead frame 10. A signal detection light receiving device 5 is bonded, with a bond member, onto a light receiving device mounting face 32a that is molded integrally with the frame 11. A hologram device 6 is bonded to the upper portion of the frame 11 with an adhesive.

Next description discusses operation of the optical pickup apparatus of the present embodiment.

A laser beam 70 emitted from the semiconductor laser device 1 in Y-axis direction along the LD mounting face 30a reaches the reflector 2 to change the direction by 90 degrees and goes out in Z-axis direction that is a thickness direction of the frame 11. Thus, the laser beam emitted from the semiconductor laser apparatus 100 is transformed into parallel rays by a collimate lens 101, bended 90 degrees by a reflection mirror 102, and condensed upon an optical disk 121 by a condenser lens 103 as shown in FIG. 3A. After that, a reflected light beam from the optical disk 121 travels the same route in reverse order, that is the order of: the condenser lens 103; the reflection mirror 102; and the collimate lens 101, and returns to the semiconductor laser apparatus 100. The returned light beam is diffracted by a hologram pattern 21 of the hologram device 6 shown in FIG. 2, and the diffracted light beam is condensed upon the signal detection light receiving device 5 along an optical axis 71. A light receiving signal obtained by photoelectric exchange conducted by the light receiving element 5 makes it possible to read data in the optical disk 121.

It is noted that a light beam emitted in the direction (-Y-axis direction) opposed to the direction of the light beam coming from the semiconductor laser device 1 toward the optical disk 121 is received by the light receiving device for monitor 4 provided in the lower portion of the semiconductor laser device 1. The output of the semiconductor laser device 1 is controlled so as to keep the amount of received light constant, by which a constant amount of light may be obtained in the optical disk 121.

Herein, as shown in FIGS. 3A to 3B, the semiconductor laser apparatus 100 is inserted in a circular through hole 51 on a casing 50 of an optical pickup apparatus, and the whole semiconductor laser apparatus 100 is rotated and adjusted such that three beams generated in the grating pattern 20 of the hologram device 6 are positioned as desired on the optical disk 121, and then the semiconductor laser apparatus 100 is bonded to the casing 50, by which an optical pickup apparatus is completed.

In this point, the center of circular-arc portions 60a, 60b of the protruding portion 60 of the insulating frame 11 is set to be aligned with an optical axis 70 of the semiconductor laser device 1, and external faces 61A, 61B of the insulating frame 11 are adjusted as reference planes so that a distance to a light emitting point of the semiconductor laser device 1 in Z-axis direction is to be a specified distance. Therefore, if the protruding portion 60 of the insulating frame 11 of the semiconductor laser apparatus 100 is inserted in the circular through hole 51 on the casing 50 of the optical pickup apparatus, and the external faces 61A, 61B serving as reference planes are disposed in the state of being in contact with the casing 50, three beams may be positioned as desired on the optical disk 121 only by performing rotating adjustment. This implements reduction of adjustment time and increase of yields.

Also, the circular-arc portions 60a, 60b of the protruding portion 60 of the insulating frame 11 is given a shape asymmetric against Y-axis direction (the center of the circular arc is displaced from the center of the external shape of the frame 11), which makes it possible to make material costs lower than the case of the symmetric shape, as well as to make a downward projecting amount 62 from the optical axis 52 shown in FIG. 3B smaller than the case of the symmetric shape, resulting in fulfilling a thinner optical pickup apparatus.

Next, description will be given of a method for manufacturing the semiconductor laser apparatus 100 of the present embodiment with reference to process drawings.

Figure 4A:
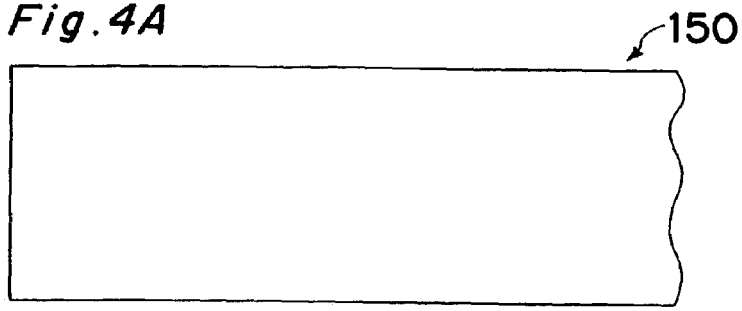
Figure 4B:
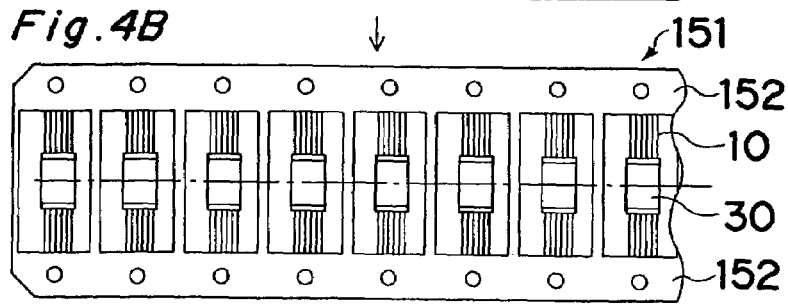
Figure 4C:
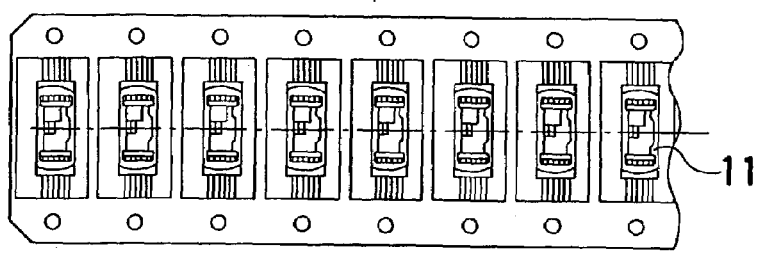
Figure 4D:
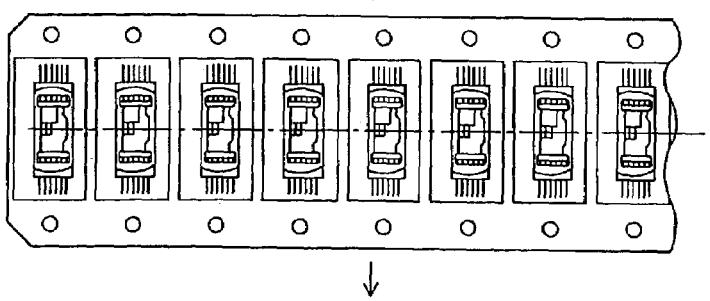
Figure 4E:
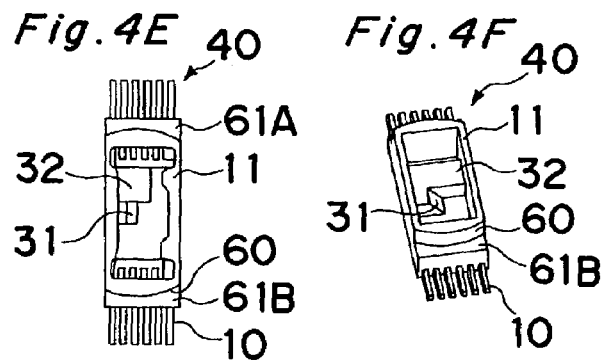
Figure 4F:
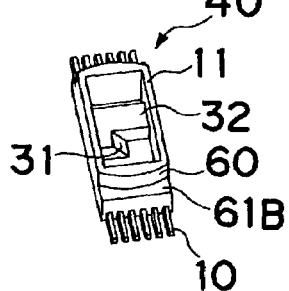
FIG. 4F is a perspective view of FIG. 4E.

FIGS. 4A to 4E are plane views each showing the process in a method for manufacturing a package composed of an insulating frame made of resin and a lead frame portion, in which FIG. 4F is a perspective view of FIG. 4E. FIGS. 5A to 5E are perspective views each showing the process of mounting a device on a package and the like. FIGS. 6A to 6E are plane views each showing the process in a method for manufacturing a package, in which FIG. 6F is a perspective view of FIG. 6E, and FIGS. 6G, 6H, 6I are side views of FIGS. 6A, 6B, 6C, respectively.

First, a lead frame portion is manufactured as shown below. A band-like metal plate material (hoop) 150 shown in FIG. 4A is press-punched or etched to form an island plate (LD mounting portion) 30 and a lead pin 10 as shown in FIG. 4B. Thus, a lead frame 151 is manufactured. Here, a couple of an island plate 30 and a lead pin 10 is connected to front and rear couples of an island plate 30 and a lead pin 10 via a frame 152 like a hoop.

Next, as shown in FIG. 4C, the lead frame 151 is resin-molded to form an insulating frame 11 that holds the lead pin 10 and the island plate 30. After molding, the lead pin 10 and the frame 152 are cut apart as shown in FIG. 4D. Thus, an individual package 40 as shown in FIGS. 4E and 4F is completed.

The resin molding is performed with use of a mold for injection molding. Here, the mold elements corresponding to reference planes (external faces) 61A, 61B, a protruding portion 60, a reflector mounting portion 31, and a signal detection light receiving device mounting portion 32 of the frame 11 are integrally provided on the mold for injection molding. This enables mass production of the package 40 having the protruding portion 60, the lead 10, the island plate (LD mounting portion) 30, the reflector mounting portion 31 and the light receiving device mounting portion 32 which are always in identical size relation (position relation) with the reference planes 61A, 61B. Consequently, in the step of mounting a reflector 2, the position of the reflector 2 is determined only by bonding the reflector 2 to a 45-degree inclined face (reflector mounting face) 31a of the reflector mounting portion 31, which eliminates the necessity of adjustment.

Next, description will be given of mounting of a device on the package 40 with reference to FIGS. 5A to 5E.

As shown in FIG. 5A, in each package 40 in the state of being connected to the frame 152, a reflector 2 is bonded to the reflector mounting face (45-degree inclined face) 31a. It is noted that if the protruding portion 60 may disturb mounting of the reflector 2 in the case of using a collet and the like, part of the protruding portion 60 may be cut away.

Then as shown in FIG. 5B, a unit having a semiconductor laser device 1 mounted on top of the light receiving device for monitor 4 is mounted on a lead frame island 30 via a conductive adhesive.

Next, as shown in FIG. 5C, a signal detection photodiode 5 is bonded onto the mounting face (light receiving device mounting face) 32a of the light receiving device mounting portion 32 integrally molded with the frame 11 with an adhesive.

Then, as shown in FIG. 5D, each device is wire-bonded to the lead 10, and then a hologram device 6 is mounted on the upper portion 64 of the frame 11 by bonding.

Next as shown in FIG. 5E, the frame 152 and the lead 10 are cut apart to complete a semiconductor laser apparatus 100.

Next, description will be given of a package suitable for a high heat-dissipation semiconductor laser apparatus with heat dissipation improved by increasing the thickness of the LD mounting portion with reference to FIGS. 6A to 6I.

A package for semiconductor laser needs to efficiently conduct heat generated by light emission of a semiconductor laser device. Accordingly, it is desirable to use copper materials with high heat-conductivity as a lead frame material and to increase the plate thickness of the lead frame in the vicinity of the semiconductor laser device.

Here, it is considered to increase the plate thickness of the entire lead frame. However, since the lead pitch (a distance between the lead and the next lead) depends on the plate thickness, increasing the plate thickness of the entire lead frame makes a package larger. Accordingly, as shown in FIG. 6I, it is effective for manufacturing a smaller and thinner package to keep the plate thickness of a lead portion 10' small and to increase the plate thickness of the most-important semiconductor laser device mounting portion 30' and the vicinity thereof.

First, as shown in FIG. 6A, there is prepared a lead frame material 160 that is a metal plate material having the plate thickness of about 1.5 times the lead plate thickness as of the completion of a package. Then, as shown in FIG. 6B, a portion of the lead frame other than the semiconductor laser device mounting portion (island plate portion) 30' is pressed to obtain the lead plate thickness as of the completion of a package. By pressing, the plate thickness of the semiconductor laser device mounting portion 30' is relatively increased, and thus a special hoop 161 is completed Next, as shown in FIG. 6C, the frame (special hoop) 161 is press-punched or etched to form an island plate 30' and a lead pin 10'. Thus, a lead frame 162 is formed.

Next, as shown in FIG. 6D, the lead frame 162 is resin-molded to form an insulating frame 11 that holds the lead pin 10' and the island plate 30'. After molding, as shown in FIGS. 6E and 6F, the lead pin 10 and the frame 152 are cut apart. This completes an individual package 40' whose plate thickness is large only in the vicinity of the LD mounting portion 30' as shown in FIG. 6E.

It is noted that the high heat-dissipation type package 40' may be manufactured only by adding the step of pressing the lead frame material 160 to the manufacturing process of the general package 40. Consequently, since the steps after resin molding may be standardized, common use of apparatuses becomes possible, and therefore reduction of manufacturing costs is achieved.

As described above, the present embodiment relates to a lead frame-type semiconductor laser apparatus 100. The frame materials 150, 160 are punched or pressed to create lead portions 10, 10' and island plate portions 30, 30', and part thereof is molded with resin to constitute the insulating frame 11.

As stated above, constituting the insulating frame 11 from resin makes it possible to insulate the leads 10, 10 from the leads 10', 10', which eliminates the necessity of molding the leads one by one to the stem via an insulating material as with the case of the prior art package shown in FIGS. 7A and 7B, thereby implementing reduction of manufacturing costs. In addition, the lead frames 151, 162 are used, which enables resin-molding in the state of a hoop where a plurality of packages are connected, resulting in increase of productivity. Further, when each component is mounted (when each device is mounted), positioning and handling of the packages 40, 40' are facilitated by handing them in the state of a hoop where a plurality of packages are connected, thereby achieving reduction of manufacturing costs of the semiconductor laser apparatus 100.

Further, in the prior art, the electrode of the semiconductor laser device are disposed at an angle of 90 degrees against the electrode of the signal detection light receiving device, which causes a problem that the package needs to be rotated 90 degrees when the device is mounted and wire-bonded. Contrary to this, in the present embodiment, the reflection mirror 2 that is inclined 45 degrees against light emission direction of LD1 is provided on the optical axis, which eliminates the necessity of 90-degree rotation of the package at the time of device mounting and wire-bonding, resulting in solving the problem of the prior art.

Generally, high accuracy is required for mounting (installing) the reflector 2. A prism has been conventionally used, though mounting of the prism needs two adjustment axes: X and θ, which causes problems in terms of productivity and yield.

Accordingly, in the present embodiment, the mounting portion (reflector mounting portion) 31 having a 45-degree inclined face (reflector mounting face) 31a for mounting thereto a riser mirror is molded integrally with the frame 11 in the insulating frame 11, and a plate-shaped reflection mirror 2 is mounted (installed) on the reflector mounting face 31a. Since the 45-degree inclined portion 31 for mounting thereto the riser mirror is integrally molded with a resin-molding mold for casing, creating the mold with good accuracy enables manufacturing of the portion with the same size and accuracy all the time. Position accuracy of the board-shaped reflection mirror 2 is maintained only by bonding the reflection mirror 2 to the 45-degree inclined face (reflector mounting face) 31a without adjustment. This facilitates adjustment at the time of mounting (installation), thereby increasing yields.

Also, since the signal detection light receiving device mounting portion 32 is also molded integrally with the frame 11, adjustment at the time of mounting (installing) the signal detection light receiving device 5 is facilitated.

According to the present embodiment as described above, complication in the method for manufacturing a package, that is a problem of the prior art, may be solved and manufacturing at low costs is enabled. Further, at the time of mounting (installing) each device, mounting (installation) may be performed without inclining the package 90 degrees, and also wire-bonding may be performed without inclining the package. This achieves increase of productivity and reduction of manufacturing costs.

According to the present invention as described above, position adjustment such as optical axis adjustment is facilitated, reduction of adjustment time in the manufacturing process as well as increase of yields are achieved, and therefore productivity may be increased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser apparatus comprising:
   an insulating frame in which at least a semiconductor laser device and a light receiving device are mounted; and
   a plurality of leads passing through each of two opposite faces of the insulating frame and extending from inside to outside of the insulating frame, wherein the insulating frame has external faces that are parallel to a mounting face on which the semiconductor laser device is mounted, and the insulating frame has a protruding portion protruding vertically against the mounting face for continuously surrounding at least the semiconductor laser device mounted on the mounting face, and wherein
   the protruding portion has two opposite cylindrical faces having a common center axis which is aligned with an optical axis of the semiconductor laser device and is displaced from a center of external shape of the insulating frame, thereby each of the two cylindrical faces have an asymmetric shape in relation to a plane that includes the optical axis of the semiconductor laser device and is parallel to the plurality of leads.

* * * * *